United States Patent [19]

Kobayashi et al.

[11] Patent Number: 5,688,116
[45] Date of Patent: Nov. 18, 1997

[54] HEAT TREATMENT PROCESS

[75] Inventors: Junichi Kobayashi, Sagamihara; Eiichiro Takanabe, Shiroyama, both of Japan

[73] Assignees: Tokyo Electron Limited; Tokyo Electron Tohoku Limited, both of Japan

[21] Appl. No.: 441,048

[22] Filed: May 15, 1995

[30] Foreign Application Priority Data

May 17, 1994 [JP] Japan ................................. 6-128127

[51] Int. Cl.$^6$ ................................................ F27D 13/00
[52] U.S. Cl. ................................................ 432/12; 432/253
[58] Field of Search ..................... 432/206, 241, 432/152, 5, 6, 253, 12, 18

[56] References Cited

U.S. PATENT DOCUMENTS 5,431,561  7/1995  Yamabe et al. ...................... 432/253

OTHER PUBLICATIONS

Japanese Patent Laid-Open Publication, Kokai, No. 5-6894 published on Jan. 1993.
English abstract of Japanese Patent Laid-Open Publication, Kokai, No. 5-6894.

*Primary Examiner*—Noah P. Kamen
*Attorney, Agent, or Firm*—Beveridge, DeGrandi, Weilacher & Young, L.L.P.

[57] ABSTRACT

A number of semiconductor wafers are held in a ladder boat at, e.g., a 3/16 inch arrangement pitch of wafers W, and the ladder boat is loaded into a vertical heat treatment furnace. Then an interior of the heat treatment furnace is heated up to 900° C. at a high temperature raising rate of, e.g., 30° C./minute. Subsequently the interior is heated in steps at low temperature raising rates, e.g., at below 14° C./minute up to a temperature region of, e.g., 980° C. and at below 5° C./minute up to a heating temperature of 1100° C. These temperature raising rates are determined, based on results given by observation of presence and absence of slips in the wafers W heat-treated in various temperature raising patterns for different wafer arrangement pitches, so that the wafers can be heat-treated effectively without occurrence of slips. Widening said arrangement pitch to 3/8 inches allows higher temperature raising rates to be set.

11 Claims, 4 Drawing Sheets

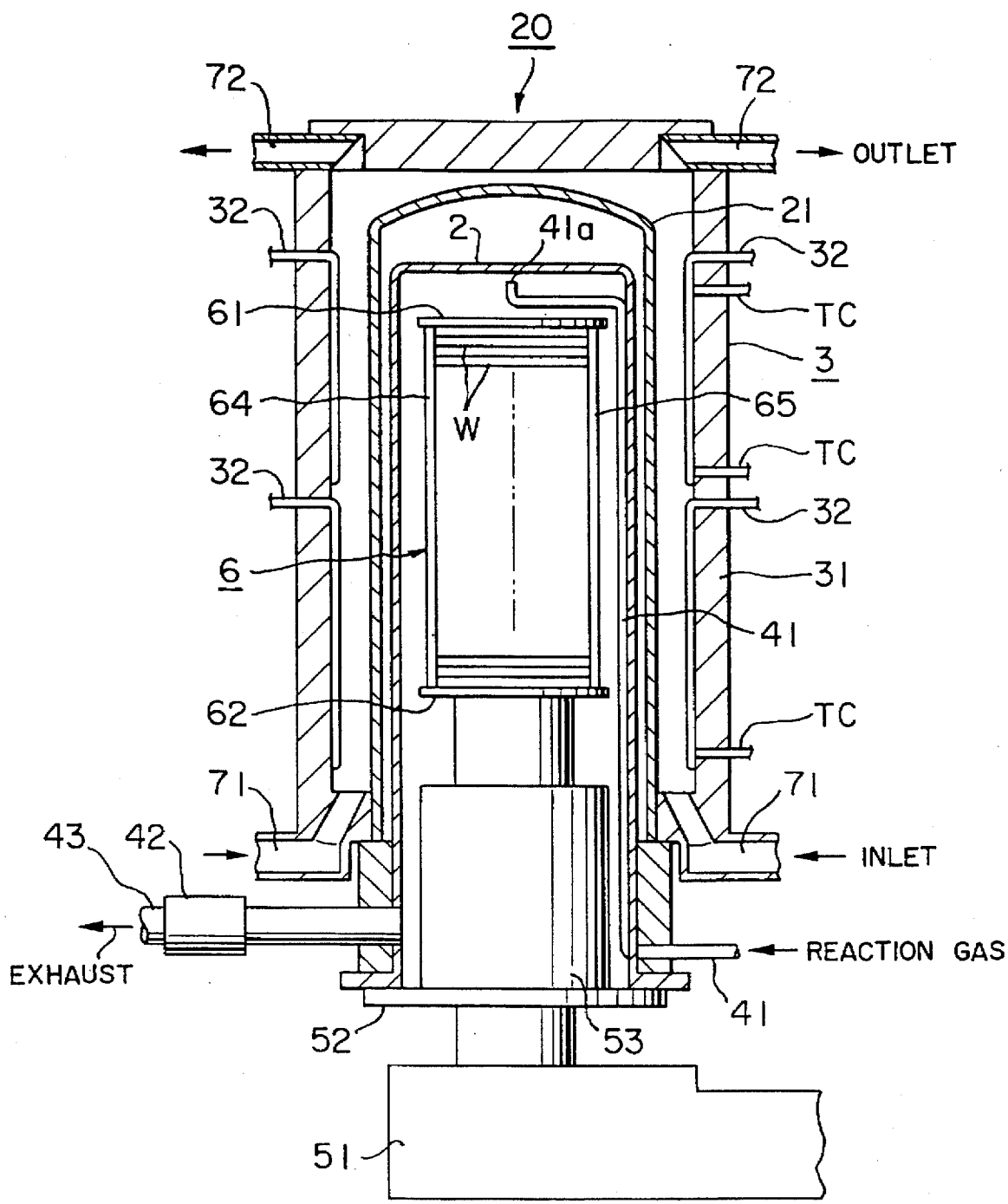
F I G. 1

HEAT TREATMENT PROCESS

BACKGROUND OF THE INVENTION

The present invention relates to a heat treatment process for conducting batch heat treatments on a number of objects to be treated.

Processing of semiconductor wafers (hereinafter called "wafers") includes heat treatments at high temperatures. This processing forms oxide films on the wafers, diffusing dopants, and others. Horizontal heat treatment furnaces have been conventionally dominant for conducting these heat treatments. But recently, vertical heat treatment furnaces are increasingly used because of their homogeneous wafer intra-surface treatment, easy loading and unloading of the wafers, little entrainment of outside air into the furnaces, etc.

A vertical heat treatment apparatus using such a vertical heat treatment furnace includes a ladder boat. A ladder boat is one kind of a vertical wafer boat which holds a number of wafers vertically spaced from each other, the wafers then can be loaded and unloaded into and out of the heat treatment furnace. The ladder boat comprises a top plate and a bottom plate vertically opposing each other, four support rods of, e.g., quartz provided between the top and the bottom plates. Grooves are formed in the respective support rods into which the peripheral edges of wafers are inserted in a set direction.

When a set number (e.g., 50 sheets) of wafers W have been mounted on the ladder boat, an elevator is used to load the ladder boat into the heat treatment furnace, then a required batch heat treatment on the wafers can be performed. Especially recently, higher speed heat treatments and higher throughputs are required in accordance with higher integration (e.g., above 60 M) and larger sizes (12 inches) of wafers.

Because silicon which is a base material of the wafers has a melting point of 1410° C., crystal defects called slip (the parts indicated by S in FIG. 9) tend to take place in vicinities of parts of the wafers supported by the support rods 63, 64, 65, 66 of the ladder boat, as shown in FIG. 9. Usually, this occurs when a heat treatment is conducted on the wafers at a temperature, e.g., 1000° C. approximate to the melting point. These slips are fine broken layers which are difficult to be visually recognized but can be seen by magnifying glasses or metal microscopes (the slips in FIG. 9 were partially visible but confirmed by a 50 magnification metal microscope).

Causes for the occurrence of the slips are: 1) internal stresses due to tare weights of the wafers; and 2) thermal strain stresses due to intra-surface temperature disuniformity of the wafers. That is, although a mechanism for the occurrence is not clear, it is considered in connection with cause 1) that because the wafers are supported by the ladder boat at the peripheral edges, supported partially at four positions, large internal stresses take place due to tare weights of the wafers being heat-treated in vicinities of the supported parts. When the internal stresses exceed a certain magnitude, the slips occur. Furthermore, even wafers having specification values have sori, and get additional sori due to temperature distributions when heated. In addition, the grooves in the support rods have machining errors. If one of the supported parts of a wafer should come out of the associated groove, the wafer is supported at three parts, and loads born by the respective supported parts are unbalanced. Consequently it often takes place that large stresses exceeding a threshold for the occurrence of the slips are generated at, e.g., one of the supported parts.

In connection with the cause 2), heat is conducted to and from the wafers via the support rods of the heat treatment boat when the wafers are heated, and temperature differences take place between the central parts of the wafers and the peripheral edges thereof and cause thermal strain stresses. It is considered that the slips occur when the thermal strain stresses exceed a certain magnitude. On the other hand, recently the structure of the heat treatment furnace itself, and the heater have been improved, and heat treatment furnaces whose low internal temperatures can be raised at a rate as high as, e.g., 100° C./minute are fabricated. A furnace which has a high-speed temperature increasing rate decrease thermal budget and can improve throughputs. On the other hand, the furnace has a disadvantage that intra-furnace temperature differences are increased upon temperature increase and decrease, and larger thermal strain stresses take place in the wafers, and the slips take place especially when the wafers are heat-treated at high temperatures approximate to the melting point of the base material of the wafers. To solve this problem, various discussion have been made on the structure of the wafer boat. For example, a wafer boat typically called a ring boat is often used. In the ring boat, wafers are not supported by grooves formed in the support rods of the boat. Rings instead are supported in the grooves, and wafers are held on the rings. The peripheral edges of the wafers surface-contact with the rings, and internal stresses of the wafers are mitigated, whereby the occurrence of the slips can be suppressed.

The ring boat, however, is difficult to fabricate and expensive. Furthermore, a robot carrier arm cannot enter between the support rods when wafers are transferred, as can in the ladder boat, a mechanism for pushing up the wafers from below to load the wafers is necessary, which makes the structure of the wafer carrier system complicated. This is also a problem. In addition, it is much required to preclude the slips without changing the structure of the wafer boat.

SUMMARY OF THE INVENTION

The present invention was made in view of these problems. An object of the present invention is to provide a heat treatment process which can preclude occurrence of slips in a heat treatment.

The present invention relates to a heat treatment process for holding a number of objects to be treated by a holding means at a vertical interval and loading the holding means into a heat treatment furnace. The objects-to-be-treated then being heat-treated while temperatures in the heat treatment furnace are controlled. The controlled temperature increasing pattern has a smaller temperature increasing rate gradient than a threshold temperature increasing rate pattern for preset heat treating temperatures, which is able to prevent occurrence of slips in the objects-to-be-treated.

It is considered that slips taking place when wafers are heat-treated occur when thermal strain stresses become large when the wafers are heated to some extent. According to the applicant's experiments, slips were observed in a range of temperatures above a heating temperature of 900° C. unless wafers were considerably gradually heated. Here the range of high temperatures includes different threshold temperature increasing rate patterns for a range of, e.g., 900°–980° C. and a range of temperatures above the former. Such threshold temperature increasing rate patterns depend on vertical arrangement pitches of the wafers.

In accordance with the present invention, a heat treatment is conducted with the arrangement pitch set at a required value and a substantial threshold temperature increasing rate pattern given for the high temperature ranges. Temperatures can be effectively raised and lowered, high throughputs can be obtained, and in addition occurrence of slips can be prevented. Threshold temperature increasing and decreasing rates for prevention of slips become lower as temperatures rise. In a high temperature range of above 900° C., for example, the temperature is raised in two steps of, e.g., 13° C./min and 5° C./min, whereby a heat treatment can be conducted effectively without occurrence of slips.

BRIEF DESCRIPTION OF THE DRAWINGS

FIG. 1 is a vertical sectional view of one example of the vertical heat treatment apparatus used for the heat treatment process according to the present invention.

DETAILED DESCRIPTION OF THE PREFERRED EMBODIMENTS

Figure 2:
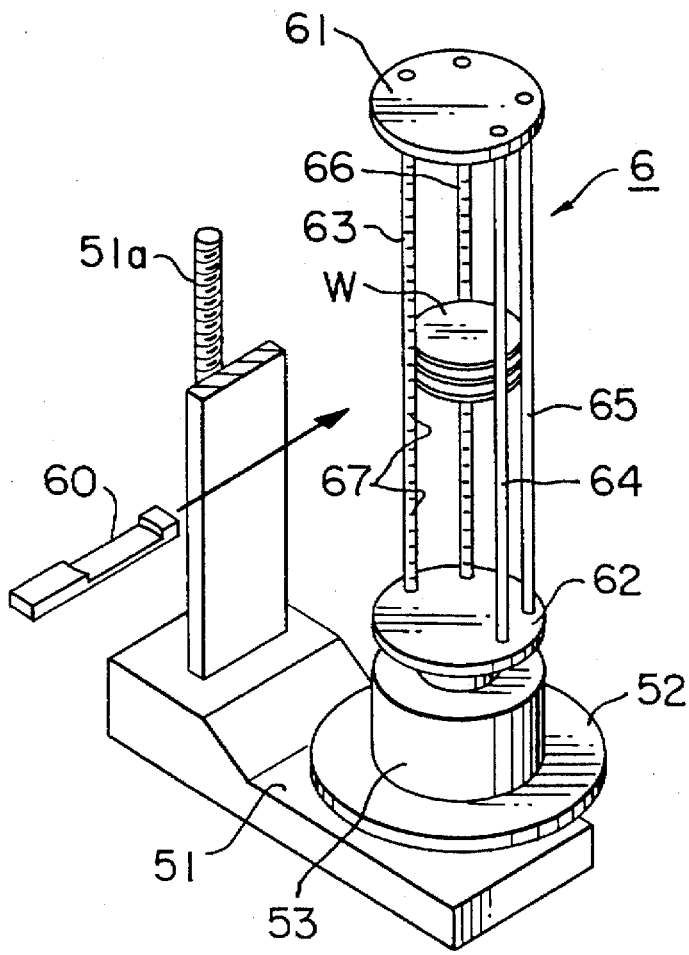
FIG. 2 is a perspective view of one example of a ladder boat used in the heat treatment process according to the present invention.

FIG. 1 is a vertical sectional view of the vertical heat treatment apparatus for practicing the process according to the present invention, which explains the general structure of the apparatus. A vertical heat treatment furnace 20 comprises a heating unit 3 enclosing a reaction tube 2. The reaction tube 2 comprises a tube of a heat resistant, corrosion resistant material (e.g., quartz) having, for example, the upper end closed and the lower end opened. A liner tube 21 of, e.g., quartz encloses the reaction tube 21. The heating unit 3 comprises a plurality of stages of heating blocks provided on the inside surface of a heat insulator 31 in such a manner as to enclose the liner tube 21. Each heating block is made of a resistance heating wire 32 vertically wound along the inside circumferential surface of the heat insulator 31. A material of the resistance heating wire 32 can be, e.g., molybdenum disilicate (MoSi$_2$) to enable high-speed temperature rise and fall. The heating wires 32 can raise an internal temperature of the reaction tube 2 at a high temperature increasing rate of 50°–100° C./min. A thermocouple TC is provided on each heating wire 32 for measuring temperatures of the heating wire 32.

A processing gas feed pipe 41 which is connected to gas supply sources not shown is inserted in the reaction tube 2. The forward end 41a of the gas feed pipe 41 is extended up to a position where the forward end 41a is opposed to the ceiling of the reaction tube 2. An exhaust pipe 43 connected to a vacuum pump 42 is provided in the reaction tube 2.

Below the reaction tube 2 there is provided a boat elevator 51 which is moved up and down on a screw rod 51a (see FIG. 2). A cap 52 is mounted on the boat elevator 51. The cap 52 air-tightly closes the open bottom of the reaction tube 2 when the cap 52 is at its uppermost position. A ladder boat 6 which is a holder is provided on the cap 52 with a heat insulating cylinder 53 provided therebetween. As shown in FIG. 2, four support rods of, e.g., quartz are provided between an upper plate 61 and a bottom plate 62 vertically opposed to each other with a required interval therebetween.

The four support rods 63–66 are so arranged that two 63, 64 of the four support rods 63–66 support the upper and the bottom plates 61, 62 at the left and the right of the forward side in the direction of advance of a wafer transfer fork 60 into the ladder boat 6, and the rest two support rods 65, 66 support the upper and the bottom plates at the left and the right of the backward side in the direction of advance of the wafer transfer fork 60 into the ladder boat 6.

Figure 3:
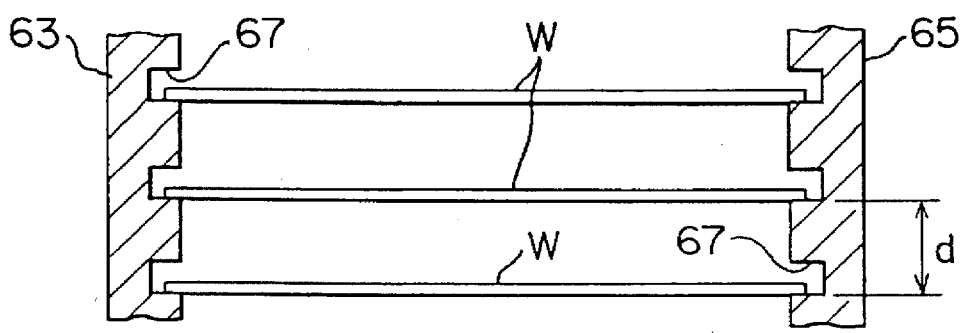
FIG. 3 is a vertical sectional view of grooves of the ladder boat of FIG. 2, and the state of wafers supported in the grooves.

As enlarged in FIG. 3, grooves 67 having a little larger vertical length than a thickness of wafers W so that the wafers W can be inserted in the grooves with the undersides of the peripheral edges supported therein are formed in the respective support rods 63–66. The wafers W are placed into the grooves 67 and taken out of the grooves 67 by the transfer fork 60 through the two forward support rods 63, 64. In the present embodiment, as shown in FIG. 3, the grooves 67 are provided at a pitch (d) of 3/16 inches. An arrangement pitch (P) of the wafers W inserted in the grooves 67 (a distance between the underside of each wafer W and that of a next below one W) is 3/16 inches.

Air inlets 71, and air outlets 72 are provided respectively in the upper end and in the bottom of the vertical heat treatment furnace 20 between the heating unit 3 and the reaction tube 2. The air inlets 71 and the air outlets 72 are provided in the reaction tube 2 circumferentially at four positions. Blower fans and exhaust fans not shown are provided respectively in the air inlets 71 and in the air outlets 72. Forced cooling means is thus constituted for forcedly cooling the interior of the reaction tube 2.

Next, an embodiment of the heat treatment process conducted by the above-described vertical heat treatment apparatus will be explained. First, the interior of the reaction tube 20 is set at 400° C. Sixty sheets, for example, of wafers W held on the ladder boat 6 are loaded into the reaction tube 2 by the boat elevator 51 through the opened bottom thereof. A vertical pitch of the grooves 67 (FIG. 3) formed in the ladder boat 6 is, e.g., 3/16 inches. The wafers W held in the grooves 67 of this pitch have an arrangement pitch of 3/16 inches.

Figure 4:
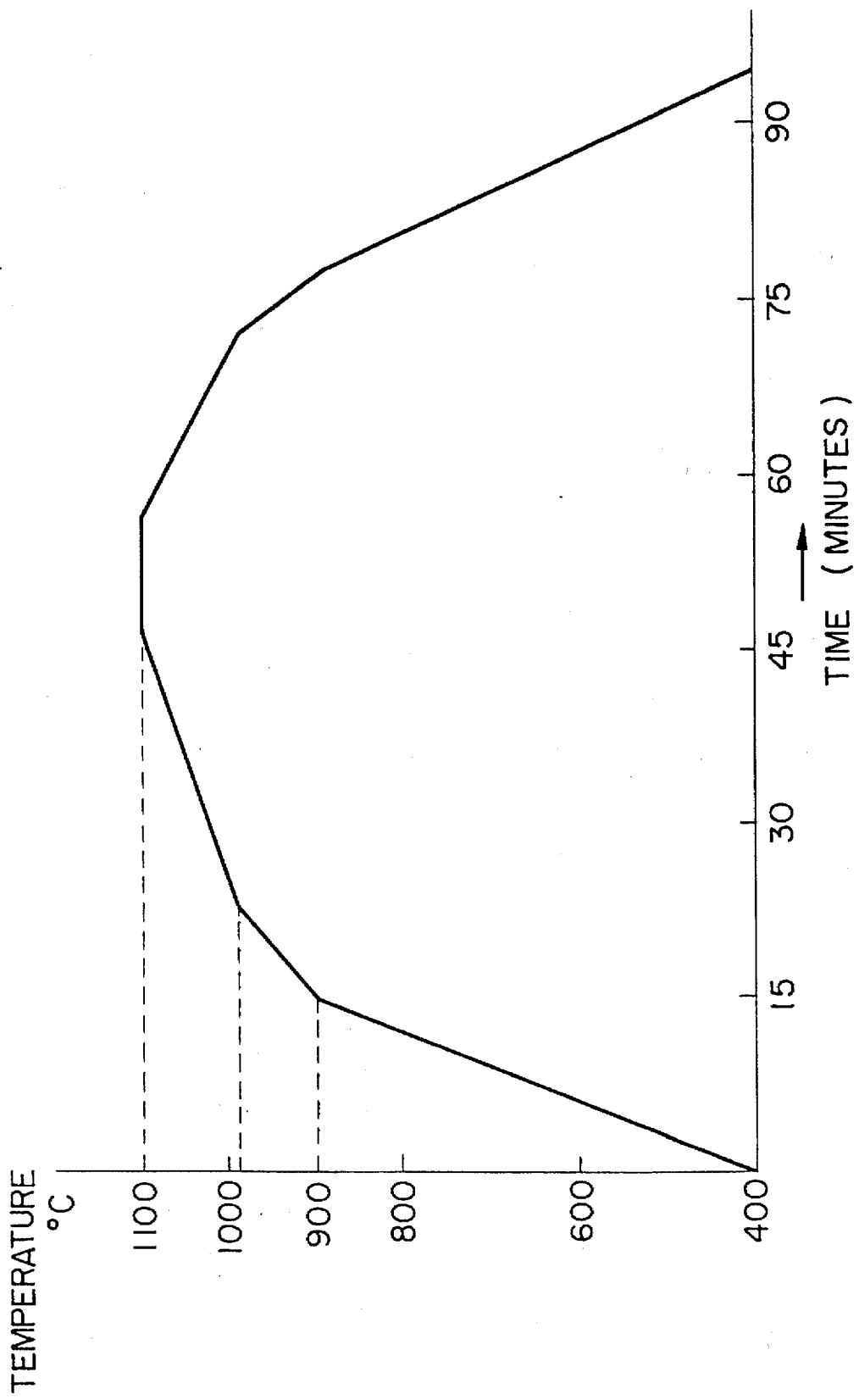
FIG. 4 is a characteristic curve of a pattern of temperature raising rates in the vertical heat treatment furnace according to an embodiment of the present invention.
Figure 5:
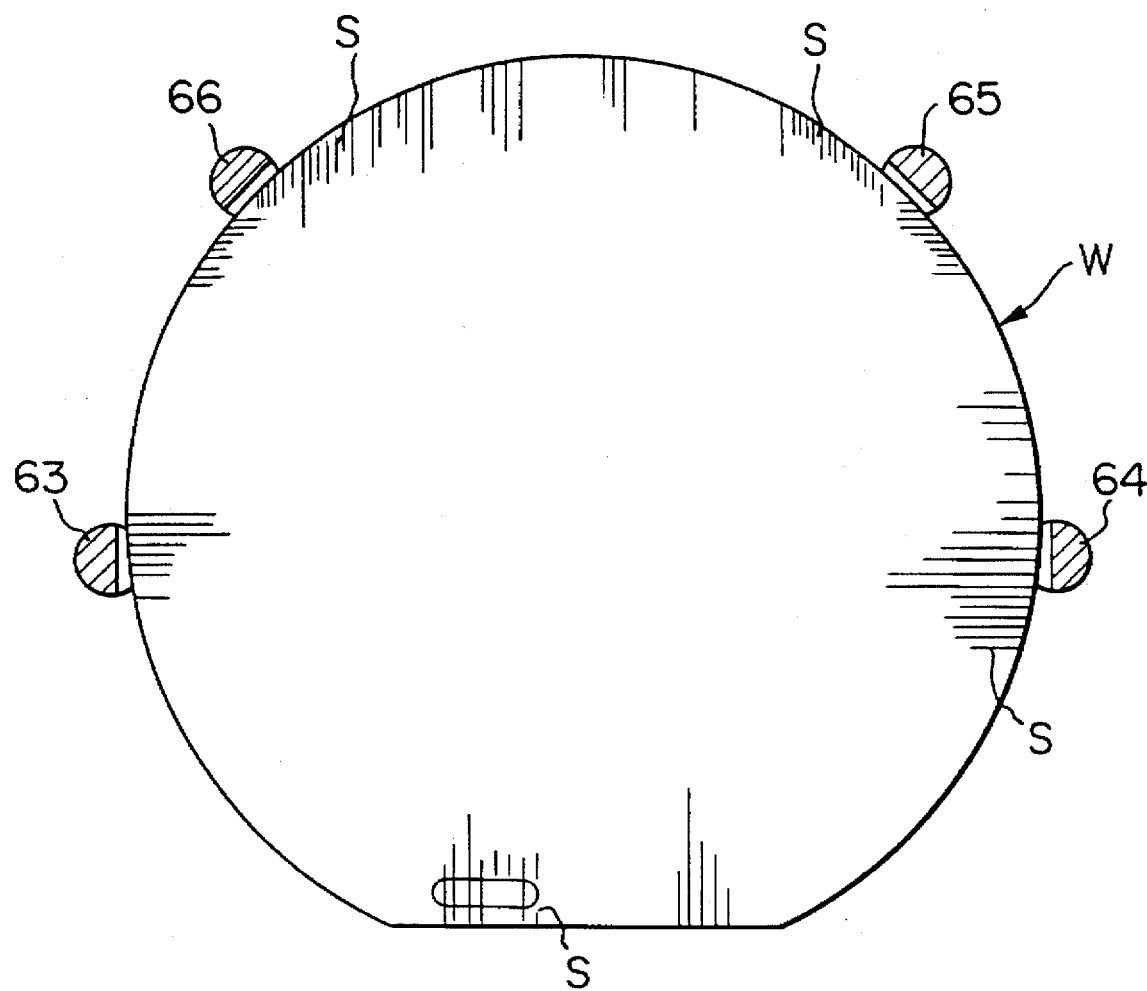
FIG. 5 is a plan view showing parts of a wafer where slips occur according to the conventional heat treatment process.

Then, electric power is supplied to the resistance heating wires 32 from the outside. The power supply is so controlled that, as shown in FIG. 4, the interior of the reaction tube 2 is heated at a high temperature increasing rate, e.g., 34° C./minute until the heat treatment region in the reaction tube 2 has a temperature of about 900° C. Here, the heat treatment region in the reaction tube 2 being about 900° C. means that because the region where those of objects-to-be-treated, wafers W held on the ladder boat except the top and the bottom dummy wafers are arranged does not have a perfectly uniform temperature distribution, the heat treatment region has a temperature range of, e.g., 900° C. plus or minus a temperature difference of the temperature distribution. Hereinafter this is the same with a temperature of the interior of the reaction tube 2. The 34° C. temperature increasing rate is not a set value for the control unit but a temperature increasing rate actually measured in the heat treatment region in the reaction tube 2 by TCs.

When a temperature of the heat treatment region in the reaction tube 2 has reached 900° C., as shown in FIG. 4, the temperature increasing rate is decreased in steps or continuously between 900° C. and 980° C. For example, the temperature in the reaction tube 2 is raised at, e.g., above 9° C./minute, a low temperature increasing rate of, e.g., about 10° C./minute, and between 980° C. and 1100° C. the temperature in the reaction tube 2 is raised at about a 5° C./minute temperature increasing rate. When the temperature in the reaction tube has reached, e.g., about 1,100° C., required oxidation gases, e.g., O₂ gas and HCl gas are fed into the reaction tube 2 through the gas feed pipe 41 while the interior of the reaction tube 2 is exhausted through the air outlets 43 to maintain a required pressure, e.g., the normal pressure in the reaction tube 2. In this state the wafers are oxidized.

Following a preset time of the oxidation, a preparatory step for a next process is conducted. For example, the interior of the reaction tube 2 is purged with an inert gas (e.g., N₂ gas) while as shown in FIG. 4, the temperature of the interior of the reaction tube is lowered down to 980° C. at a set temperature decreasing rate (e.g., 8° C./minute) and subsequently down to 900° C. at an about 15° C./minute temperature decreasing rate. Then, air is forcedly blown between the reaction tube 2 and the heating unit 3 through the air inlets 71 while exhausted through the air outlets 72, whereby the interior of the reaction tube 2 is forcedly cooled down to, e.g., 400° C. at an about 30° C./minute temperature decreasing rate, and then the cap 52 is opened to unload the ladder boat out of the reaction tube 2.

As evident from the following experimental results, by the heat treatment process according to the present invention, no slips occur in the wafers W, and high throughputs can be obtained. That is, presence of slips was checked in 6-inch wafers W held on the ladder boat at a vertical wafer arrangement pitch of 3⁄16 inches and at various temperature increasing rates. In the temperature increasing rate pattern, the temperature (400° C.) at which the wafers W were loaded was raised to 900° C. at a high rate (e.g., 30° C./minute) and raised at the low rate in the temperature range of above 900° C.. TABLE 1 shows the temperature ranges, temperature increasing rates and presence of slips. Temperature increasing rates are averages of temperatures of a wafer in the tenth grooves (indicated by "10" on the left in TABLE 1) of the ladder boat from the bottom and of a wafer in the thirteenth grooves (indicated by "31" on the left in TABLE 1) from the bottom by thermocouples at totally 4 positions, i.e., the quarters of the circumference which is 10 mm inner of the circumferential edge, and the center.

By checking presence of slips in various temperature increasing rate patterns (for example, visually confirming presence of slips and reconfirm by a 100-magnification metal microscope or etching), suitable temperature increasing rates can be found. That is, as shown in TABLE 1, in Test Run 1, in which a temperature increasing rate was 13° C./minute from 900 to 1100° C. (the higher one of the temperature increasing rates of the tenth and the thirteenth wafers from the bottom of the ladder boat 6 was taken), slips occurred. But no slip took place as in Test Run 3, in which a temperature increasing rate was as low as 6° C./minute in the range of temperatures above 980° C. In Test Runs 3 and 4, a temperature increasing rate was as high as 14° C./minute from 900 to 980° C., no slip took place. Thus it is found that no slip occurs with a temperature increasing rate of below 14° C./minute or below 6° C./minute from 900 to 980° C. and from 980 to 1100° C.. Accordingly, a temperature increasing rate is lowered in steps (two steps in the above-described embodiment) in the ranges of temperatures above 900° C. A threshold temperature increasing rate pattern which causes no slip is determined in advance, and based on the determined temperature raising rate pattern, temperature increasing rates are set, whereby slips in the wafers can be precluded, and high throughputs can be obtained.

As in Test Run 4, no slip took place even at a high temperature increasing rate of, e.g., 43° C./minute in the range of temperatures below 900° C. This agrees with the inventors' finding in their preparatory experiments that temperature increasing rates become very influential at temperatures above about 900° C.. Therefore, it is necessary that the interior of the reaction tube 2 is heated at a high temperature increasing rate up to 900° C. after the ladder boat has been loaded into the reaction tube 2, and the temperature is raised in steps at low temperature increasing rates in the ranges of temperatures above 900° C. so as to ensure high throughputs without slips.

The temperature decreasing process is considered to be the same as the temperature increasing process. It is difficult to control the temperature decreasing process. It is preferred that blowing rates of the forced cooling means are adjusted to give a threshold temperature decreasing rate pattern.

The reason the temperature increasing rate has to be lowered in the ranges of temperatures above 900° C., as described above, is that the base material, silicon, whose melting point is 1,410° C., becomes sensitive to internal stresses when a heating temperature is above about 900° C. The sensitivity increases with increases of the heating tem-

TABLE 1

(Wafer arrangement pitch: 3⁄16 inches)

| | Groove Ordinal Number | Temperature Range °C. | | | | | | Presence of Slip |
|---|---|---|---|---|---|---|---|---|
| | | 400–900 | 900–980 | 980–1100 | 1100–980 | 980–900 | 900–400 | |
| | | °C./Min | | | | | | |
| TEST RUN 1 | 10 | 34 | 11 | 11 | 7 | 14 | 30 | present |
| | 31 | 31 | 13 | 13 | 7 | 24 | 29 | |
| TEST RUN 2 | 10 | 34 | 11 | 7 | 7 | 14 | 30 | present |
| | 31 | 31 | 13 | 7 | 7 | 14 | 29 | |
| TEST RUN 3 | 10 | 34 | 11 | 6 | 7 | 14 | 30 | absent |
| | 31 | 31 | 13 | 6 | 7 | 14 | 29 | |
| TEST RUN 4 | 10 | 43 | 12 | 5 | 7 | 14 | 30 | absent |
| | 31 | 43 | 14 | 5 | 7 | 14 | 29 | |
| TEST RUN 5 | 10 | 43 | 17 | 5 | 7 | 14 | 30 | present |
| | 31 | 43 | 19 | 5 | 7 | 14 | 29 | |
| TEST RUN 6 | 10 | 43 | 12 | 5 | 10 | 16 | 30 | present |
| | 31 | 43 | 14 | 5 | 16 | 16 | 29 | | perature. It is considered that unless the temperature increasing rate is low, slips occur.

Six-inch wafers, as wafers W, as used in the above-described experiment, were arranged on the ladder boat at a ⅜ inch arrangement pitch. The presence of slips was then checked for the respective temperature increasing rates of various temperature increasing rate patterns by the use of the same apparatus (FIG. 1) as in the above-described experiment. The result is shown in TABLE 2.

from, and which is inexpensive, is used, and occurrence of slips can be prevented while a treatment is conducted at high throughputs. An industrial advantageous heat treatment process can be provided. The threshold temperature increasing rate is low especially above 900° C. and becomes lower for higher heating temperature ranges. Accordingly it is preferred to prevent occurrence of slips and obtain high throughputs that the temperature is raised at a high temperature increasing rate up to 900° C., and thereafter the rate is lowered in steps. In future the heat treatment apparatus is

TABLE 2

(Wafer arrangement pitch: ⅜ inches)

| | Groove Ordinal Number | Temperature Range °C. | | | | | | Presence of Slip |
|---|---|---|---|---|---|---|---|---|
| | | 400–900 | 900–980 | 980–1100 | 1100–980 | 980–900 | 900–400 | |
| | | °C./Min | | | | | | |
| TEST RUN 1 | 10 31 | 62 54 | 17 18 | 12 12 | 13 13 | 14 14 | 34 34 | present |
| TEST RUN 2 | 10 31 | 62 54 | 17 18 | 9 9 | 13 13 | 14 14 | 34 34 | present |
| TEST RUN 3 | 10 31 | 62 54 | 17 18 | 8 8 | 13 13 | 14 14 | 34 34 | absent |
| TEST RUN 4 | 10 31 | 62 54 | 18 19 | 7 7 | 13 13 | 14 14 | 34 34 | absent |
| TEST RUN 5 | 10 31 | 62 54 | 23 23 | 7 7 | 13 13 | 14 14 | 34 34 | present |
| TEST RUN 6 | 10 31 | 62 54 | 23 23 | 7 7 | 7 7 | 22 22 | 34 34 | present |

As evident from the results of RUN 2 and RUN 3 in TABLE 2, no slip occurs in the wafers in the temperature range of 980°–1,100° C. at a temperature increasing rate of below 8° C./minute. As evident from the result of RUN 3 and RUN 4 in TABLE 2, no slip takes place in the temperature range of 900°–980° C. at a temperature increasing rate of 18° C./minute. Here the case of 3/16 inch arrangement pitch of wafers on the ladder boat, and that of ⅜ inch arrangement pitch will be compared with each other. Setting the wafers at the ⅜ inch arrangement pitch resulted in the higher threshold temperature increasing rate for the absence of slips. Accordingly it is found that wider wafer arrangement pitch is effective for ensuring prevention of occurrence of slips. A reason for this is considered to be that a larger spacing between each of the wafers and its adjacent one permits radiation from the surrounding heating unit 3 to directly reach the central part of the wafers with a result that intra-surface temperature uniformity of the wafers transiently becomes higher. Based on the above-described experimental results, in cases of wafer arrangement pitches above the 3/16 inch arrangement pitch, and cases of wafer arrangement pitches above the ⅜ inches, occurrence of slips can be prevented by raising the temperatures at lower temperature increasing rates lower than the above-described respective threshold temperature increasing rate.

Because threshold temperature increasing rates thus change depending on wafer arrangement pitches, threshold temperature increasing rates are found by changing a temperature increasing rate pattern for a wafer arrangement pitch, and a temperature increasing pattern is set, based on the threshold temperature increasing rate pattern. Thus a temperature increasing rate pattern is set for operation of the heat treatment apparatus. As a result, without using the ring boat, which is difficult for wafers to be transferred to and from, and which is expensive, the ladder boat as shown in FIG. 2, which is easy for wafers to be transferred to and expected to be more improved and allow higher temperature increasing rates. The heat treatment process according to the present invention is effective to use such improved heat treatment apparatus. The present invention is applied to the ladder boat but is applicable to the ring boat.

As described above, according to the present invention, slips can be prevented in loading a number of wafers into a heat treatment furnace and heat-treating the same.

What is claimed is:

1. A process for heat treating a plurality of objects supported by a holding means at a vertical interval in a heat treatment furnace, the process comprising:

heating the objects at a first temperature raising rate which is smaller than a preset threshold temperature raising rate associated with occurrence of slips in the objects; and heating the objects at a second temperature raising rate which is lower than the first temperature raising rate after a heating region in the heat treatment furnace reaches about 900° C.

2. A process for heat treating a plurality of objects using a holding means having a plurality of support rods with a number of grooves defined therein at a vertical interval, the objects being supported in the grooves in a shelf-like manner and loaded into a heat treatment furnace, an interior of the heat treatment furnace being raised to a heat treatment temperature to conduct the heat treating of the objects, the process comprising:

heating the interior of the heat treatment furnace initially at a high temperature raising rate; and heating the interior of the heat treatment furnace at a temperature raising rate which is lower than the high temperature raising rate after the interior of the heat treatment furnace is heated to a set heating temperature.

3. A process for heat treating a plurality of objects using a holding means having a plurality of support rods with a number of grooves defined therein at a vertical interval, the objects being supported in the grooves in a shelf-like manner and loaded into a heat treatment furnace, an interior of the heat treatment furnace being heated to a heat treatment temperature to conduct the heat treating of the objects, the process comprising:

arranging the objects at a pitch above 3/16 inches; and heating the objects at a temperature raising rate below 14° C./minute when a temperature of a heat treatment region in the heat treatment furnace is 900°–980° C.

4. A process for heat treating according to claim 3, further comprising the step of:

heating the objects at a temperature raising rate below 6° C./minute when the temperature of the heat treatment region in the heat treatment furnace is 980°–1100° C.

5. A process for heat treating a plurality of objects using a holding means having a plurality of support rods with a number of grooves defined therein at a vertical interval, the objects being supported in the grooves in a shelf-like manner and loaded into a heat treatment furnace, an interior of the heat treatment furnace being heated to a heat treatment temperature to conduct the heat treating of the objects, the process comprising:

heating the interior of the heat treatment furnace initially at a high temperature raising rate; and heating the interior at a temperature raising rate lower than said high temperature raising rate after the interior of the heat treating furnace is heated to a set heating temperature, the process further comprising:

arranging the objects at a pitch above 3/8 inches, and when a temperature of a heat treatment region in the heat treatment furnace is 900–980° C., raising the temperature at a temperature raising rate below 19° C./minute.

6. A process for heat treating according to claim 5, wherein when the temperature in the heat treatment region in the heat treatment furnace is 980°–1100° C., the temperature raising rate is below 8° C./minute.

7. A process for heat treating semiconductor wafers mounted in a mounting jig in a heat treating furnace, comprising:

heating said wafers at a first heating rate to a first preset temperature;

heating said wafers at a second heating rate to a second preset temperature; and heating said wafers at a third heating rate to a third preset temperature.

8. A process for heat treating semiconductor wafers as defined in claim 7, wherein:

said second heating rate is lower than said first heating rate.

9. A process for heat treating semiconductor wafers as defined in claim 7, wherein:

said third heating rate is lower than said second heating rate.

10. A process for heat treating semiconductor wafers as defined in claim 7, wherein:

said first heating rate is below 34° C./minute, said second heating rate is below 14° C./minute, and said third heating rate is below 6° C./minute.

11. A process for heat treating semiconductor wafers as defined in claim 10, wherein said first preset temperature is about 900° C., said second preset temperature is about 980° C., and said third preset temperature is about 1100° C.

* * * * *